United States Patent [19]

Kai et al.

[11] Patent Number: 4,813,021

[45] Date of Patent: Mar. 14, 1989

[54] SEMICONDUCTOR MEMORY DEVICE WITH DELAYED PRECHARGE SIGNALS

[75] Inventors: Hajime Kai, Kawasaki; Kiyofumi Ochii, Yokohama, both of Japan

[73] Assignee: Tokyo Shibayra Denki Kabushiki Kaisha, Kawasaki, Japan

[21] Appl. No.: 735,724

[22] Filed: May 20, 1985

Related U.S. Application Data

[63] Continuation of Ser. No. 401,692, Jul. 26, 1982, abandoned.

[30] Foreign Application Priority Data

Jul. 27, 1981 [JP] Japan .................................. 56-117442

[51] Int. Cl.$^4$ ................................................ G11C 7/00
[52] U.S. Cl. ..................................... 365/194; 365/203; 365/227; 365/233
[58] Field of Search ............... 365/194, 190, 203, 227, 365/205, 207, 208, 233

[56] References Cited

U.S. PATENT DOCUMENTS

| | | | |
|---|---|---|---|
| 3,848,237 | 11/1974 | Geilhufe | 365/226 |
| 3,953,839 | 4/1976 | Dennison et al. | 365/190 |
| 4,123,799 | 10/1978 | Peterson | 365/205 |
| 4,204,277 | 5/1980 | Kinoshita | 365/203 |
| 4,222,112 | 9/1980 | Clemons et al. | 365/194 |
| 4,223,396 | 9/1980 | Kinoshita | 365/194 |
| 4,379,344 | 4/1983 | Ozawa et al. | 365/203 |

FOREIGN PATENT DOCUMENTS

| | | | |
|---|---|---|---|
| 3219379 | 12/1982 | Fed. Rep. of Germany. | |
| 0150045 | 11/1979 | Japan | 365/203 |
| 0132589 | 10/1980 | Japan | 365/227 |
| 2028044 | 2/1980 | United Kingdom. | |

Primary Examiner—Stuart N. Hecker
Assistant Examiner—Glen Gossage
Attorney, Agent, or Firm—Finnegan, Henderson, Farabow, Garrett, & Dunner

[57] ABSTRACT

A semiconductor memory device includes memory cells arranged in a matrix array, a plurality of pairs of bit lines, each pair of bit lines being connected to the memory cells on the same column, a plurality of pairs of switching MOS transistors, each pair of MOS transistors being connected between a power source terminal and each pair of bit lines, and a precharge control circuit for supplying a control signal to the gates of the switching MOS transistors. This memory device further includes delay circuits connected in series with each other, and the delay circuits delay the control signal from the precharge control circuit and supply the control signal to the gates of the switching MOS transistors at different timings.

11 Claims, 6 Drawing Sheets

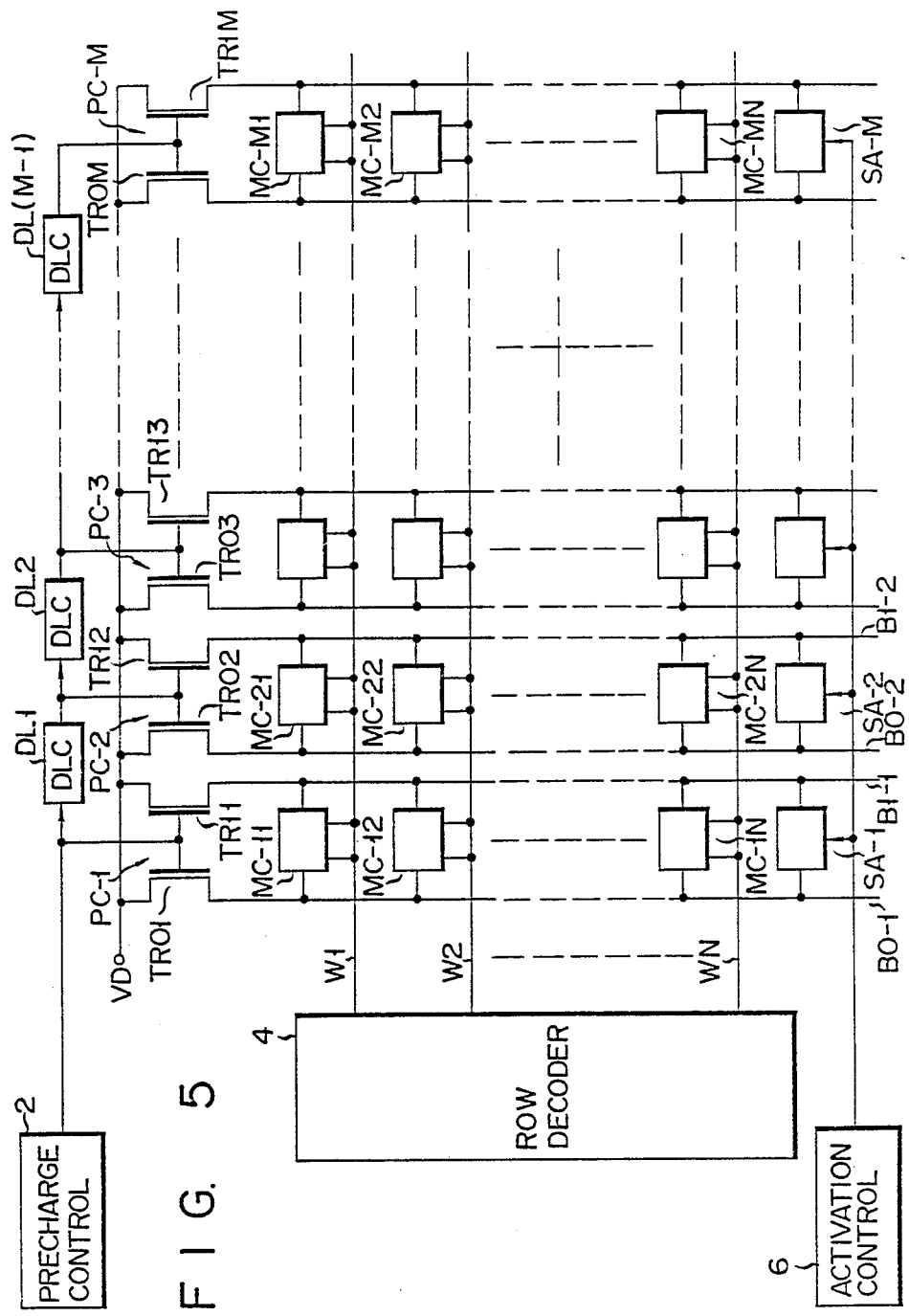
F I G. 5

SEMICONDUCTOR MEMORY DEVICE WITH DELAYED PRECHARGE SIGNALS

This application is a continuation of application Ser. No. 401,692, filed July 26, 1982, now abandoned.

BACKGROUND OF THE INVENTION

The present invention relates to a semiconductor memory device.

The memory capacity of a semiconductor memory device has been recently increasing at a rate of four times every 2 to 3 years, and this trend is expected to continue in the future. This trend can be generally applied to all semiconductor memory devices irrespective of type, e.g., whether it is a random access memory or a read-only memory, or a dynamic memory or a static memory. As the memory capacity of the semiconductor memory device has increased, several problems have arisen. For instance, there is the problem of the increase in consumed current and particularly instantaneous peak current during operation. The increase in the instantaneous peak current results in the incrase of high frequency variation of a voltage component of a power source voltage. Consequently, a voltage noise is produced due to an induced voltage or the like in an input signal line and a signal line wired in a memory chip. In this respect, the operating margin of the memory circuit is limited, and various complicated circuits are accordingly required in actual use. Particularly in a dynamic memory or a static memory having an internal circuit operated in substantially a dynamic mode, charging and discharging currents flow through a number of signal lines, including essential signal lines. As a result, most signal lines are set to the initial state. Since the stray capacitance associated with the essential signal lines will generally increase as the memory capacity is increased, the charging and discharging currents flowing at the time of setting the initial states also increase. Further, in order to attain a higher operating speed of the memory device, the charging and discharging operations for the stray capacitance are carried out at a higher speed. Thus, the charging and discharging current characteristics become more abrupt.

FIG. 1 shows a conventional semiconductor memory device which has memory cells MC-11 to MC-MN arranged in a matrix array. Those of memory cells MC-11 to MC-MN disposed in the same row are commonly connected to a corresponding one of word lines W1 to WN. For example, the memory cells MC-12 to MC-M2 are connected to the word line W2. Those of the memory cells MC-11 to MC-MN arranged in the same column are commonly connected to a corresponding one of pairs of bit lines B0-1 and B1-1, B0-2 and B1-2, . . . , and B0-M and B1-M. The memory cells MC-21 and MC-2N are connected, for example, to the bit lines B0-2 and B1-2. The ends of the bit lines B0-1 to B0-M are respectively connected through MOS transistors TR01 to TR0M to a power source terminal VD, and the ends of the bit lines B1-1 to B1-M are respectively connected through the MOS transistor TR11 to TR1M to the power source terminal VD. The gates of the MOS transistors TR01 to TR0M and TR11 to TR1M are all connected to a precharge control circuit 2, and thus the MOS transistors TR01 to TR0M cooperate with the MOS transistors TR11 to TR1M to form precharge circuits PC-1 to PC-M, respectively. The word lines W1 to WN are connected to the row decoder circuit 4, and a row selection signal from the row decoder circuit 4 is selectively supplied to memory cells.

Moreover, sense amplifiers SA-1 to SA-M are respectively connected between the bit lines B0-1 and B1-1, B0-2 and B1-2, . . . , and B0-M and B1-M. An activation control circuit 6 is connectd to these sense amplifiers SA-1 to SA-M, and the sense amplifiers SA-1 to SA-M are substantially simultaneously energized by the activation signal from the activation control circuit 6, thereby amplifying data signals on the corresponding bit lines.

FIG. 2 shows a circuit diagram of the memory cell MC-11 shown in FIG. 1. The other memory cells are composed similarly to the memory cell MC-11 shown in FIG. 2. This memory cell MC-11 has load MOS transistors 10 and 11 as well as driving MOS transistors 12 and 13 connected to form a flip-flop. Transfer MOS transistors 14 and 15 are each connected between one of the bistable output terminals of the flip-flop and one of the bit lines B0-1 and B1-1. The gates of these MOS transistors 14 and 15 are connected to a word line W1.

FIG. 3 shows a circuit diagram of the sense amplifier SA-1 shown in FIG. 1. The other sense amplifiers SA-2 to SA-M are formed similarly to the sense amplifier SA-1. This sense amplifier SA-1 has load MOS transistors 20 and 21 as well as driving MOS transistors 22 and 23 connected to form a flip-flop, and an MOS transistor connected between a power source terminal VS and the driving MOS transistors 22 and 23. The gate of this MOS transistor 24 is connected to the activation control circuit 6.

In a conventional memory device as shown in FIGS. 1 through 3, the occupying area of the memory cells becomes very large with respect to the entire chip. The area of the chip depends mostly upon the size of the memory cells. Therefore, it is necessary to minimize the size of the respective memory cells as well as to form word lines of polycrystalline silicon, which is also used to form the gates of the MOS transistors 10 to 15 of the memory cells, and to arrange them rectilinearly. However, in this case, a stray capacitance is produced in a word line in a distributed-constant manner, with the result that a row selection signal on the word line W1 from the row decoder 4 is, for example, applied as an effective signal to the memory cell MS-M1 after a predetermined delay from the application of the signal to the memory cell MC-11. As the distance between the memory cells MC-11 and MC-MN is increased, the delay is accordingly lengthened.

In a case where a precharge control signal from the precharge control circuit 2 falls to a low level, as shown in FIG. 4A, the transistors TR01 to TR0M and TR11 to TR1M are rendered conductive. The bit lines B0-1 to B0-M and B1-1 to B1-M are resultantly connected through these transistors to the power source terminal VD. As a consequence, the potential of these bit lines is raised up to the VD level as shown in FIG. 4B. In this case, the precharge currents will simultaneously flow through the power source terminal VD to all the bit lines B0-1 to B0-M and B1-1 to B1-M. That is, the total of these precharge currents will instantaneously flow, as shown in FIG. 4C, through the power line (not shown) connecting the power source (not shown) to the power source terminal VD. The row selection signal is generated from the row detector circuit 4 as shown in FIG. 4D, after the bit llines B0-1 to B0-M and B1-1 to B1-M are precharged up to the predetermined voltage level in this manner. As shown in FIG. 4E, this row selection signal is applied to the memory cell disposed on the row located the most distant from the row decoder circuit 4 after the predetermined time is elapsed.

Since all the bit lines are simultaneously precharged to the predetermined voltage level in the memory device shown in FIG. 1, as described above, when the precharging operation starts, a peak current having a high instantaneous value will flow through the current line connected to the power source terminal VD. Thus, a noise voltage is induced to the input signal line, etc., as described above, thereby effecting an adverse influence to the operation of the conventional memory device.

Since a discharging current will flow through the MOS transistor 24 and the corresponding MOS transistors of the other sense amplifiers SA-2 to SA-M when the sense amplifiers SA-1 to SA-M are energized simultaneously, a large peak current will flow through the power line (not shown) connected to the power source terminal VS. Thus, the same problem as described above will occur.

SUMMARY OF THE INVENTION

It is an object of the present invention to provide a semiconductor memory device which prevents the production' of a peak current having a high instantaneous value on a power line.

The above and other objects can be performed by providing a semiconductor memory device which comprises a plurality of memory cells disposed respectively on a plurality of columns, but lines connected respectively to the memory cells on the same column, and means for introducing operation currents in different phases from the bit lines.

In one embodiment of the semiconductor memory device according to the present invention, a plurality of bit lines are so connected in different phases as to charge or discharge. Charging or discharging current will thus flow in the different phase through these bit lines. Even if the charging or discharging currents are added and their energizing period thus prolonged, the peak value of the total current does not become extremely large and exercises almost no adverse influence on the other signal lines.

BRIEF DESCRIPTION OF THE DRAWINGS

FIG. 5 is a circuit diagram of a semiconductor memory device according to one preferred embodiment of the present invention;

DETAILED DESCRIPTION OF THE PREFERRED EMBODIMENTS

The present invention will now be described in more detail with reference to the accompanying drawings.

Figure 1:
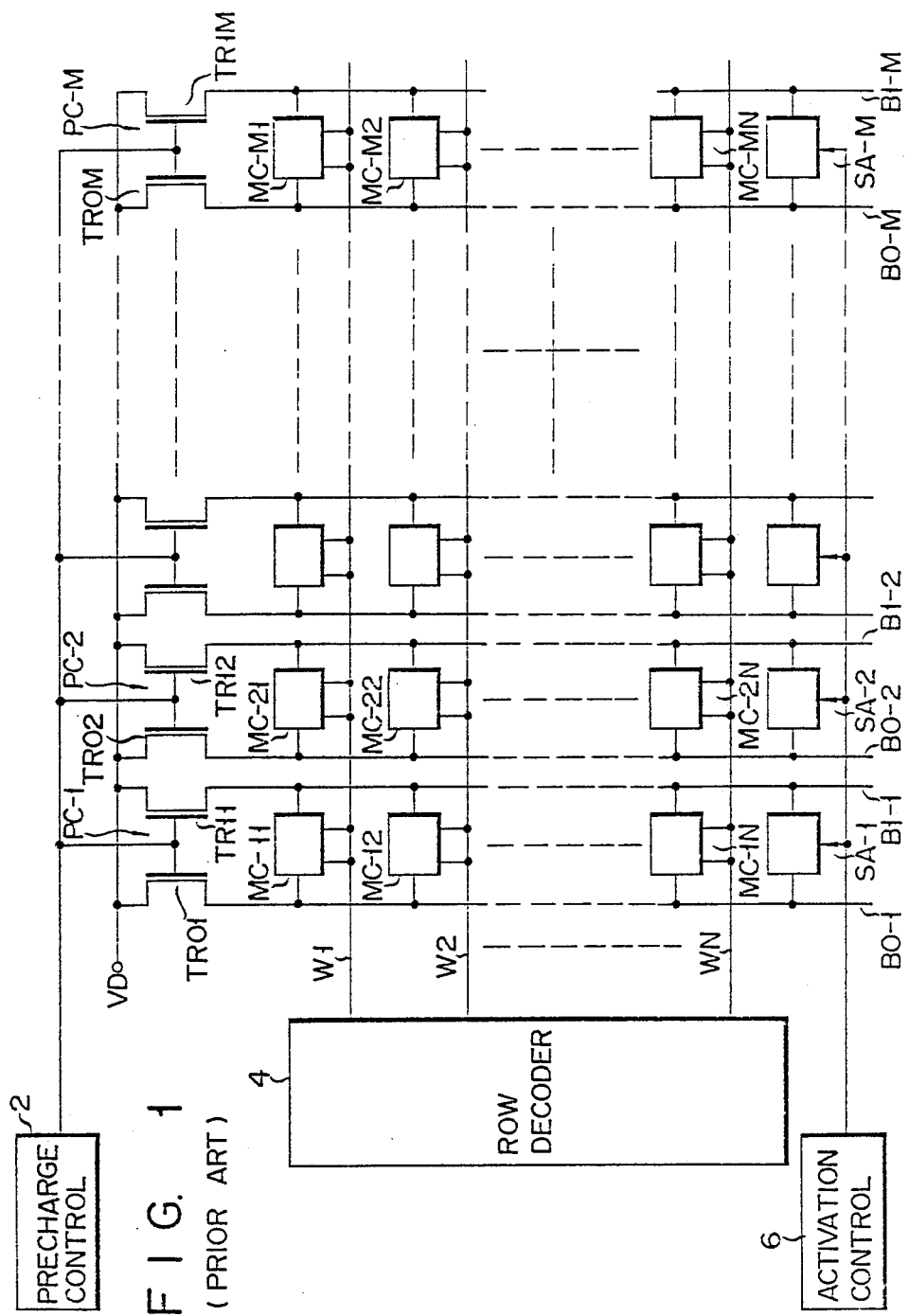
FIG. 1 is a circuit diagram of a conventional semiconductor memory device.
Figure 2:
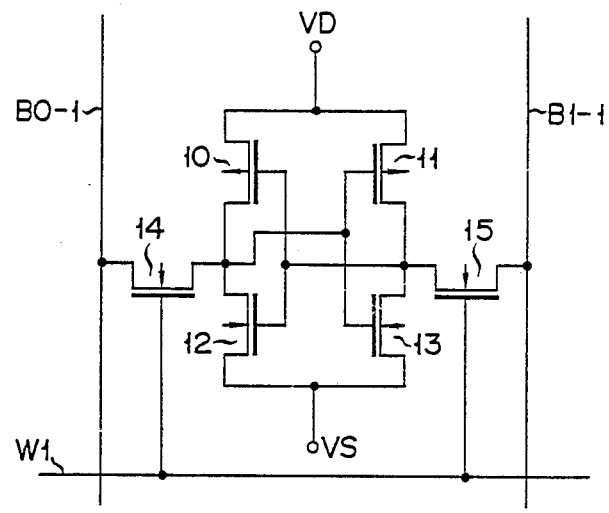
FIG. 2 is a circuit diagram of the memory cell used in the semiconductor memory device shown in FIG. 1.
Figure 3:
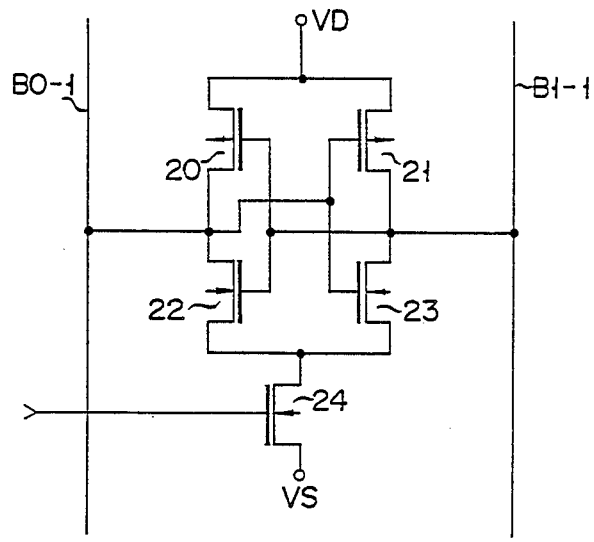
FIG. 3 is a circuit diagram of the sense amplifier circuit used in the semiconductor memory device shown in FIG. 1.

FIG. 5 shows a semiconductor memory device according to one preferred embodiment of the present invention. This semiconductor memory device includes, as does the semiconductor memory device shown in FIG. 1, memory cells MC-11 to MC-MN arranged in a matrix array, a plurality of pairs of bit lines B0-1 and B1-1, B0-2 and B1-2, ..., and B0-M and B1-M connected to the memory cells on the same column, and sense amplifier circuits SA1, SA2, ..., and SA-M connected between the bit lines of the respective pairs. The memory cells on the same row are each connected through a corresponding one of word lines W1 to WN to a row decoder circuit 4, and the output line of an activation control circuit 6 is connected to the sense amplifier circuits SA-1 to SA-N. Further, the bit lines B0-1 and B1-1, B0-2 and B1-2, ..., and B0-M and B1-M are respectively connected through paired MOS transistors TR01 and TR11, TR02 and TR12, ..., and TR0M and TR1M respectively forming precharge circuits PC-1, ..., and PC-M to a power source terminal VD. THe memory cells are composed in the same manner as the circuit shown in FIG. 2, and the sense amplifier circuits are composed in the same manner as the circuit shown in FIG. 3.

Further, this semiconductor memory device includes delay circuits DL1 to DL(M-1) connected in series with each other. The input terminal of the delay circuit DL-1 is connected to the input terminal of the precharge control circuit 2. The output terminals of these delay circuits DL1, DL2, ..., and DL(M-1) are respectively connected to the gates of the paired MOS transistors TR02 and TR12, TR03 and TR13, ..., and TR0M and TR1M. The output terminal of the precharge control circuit 2 is also connected to the gates of the MOS transistors TR01 and TR11.

Figures 4A, 4B, 4C, 4D, 4E:
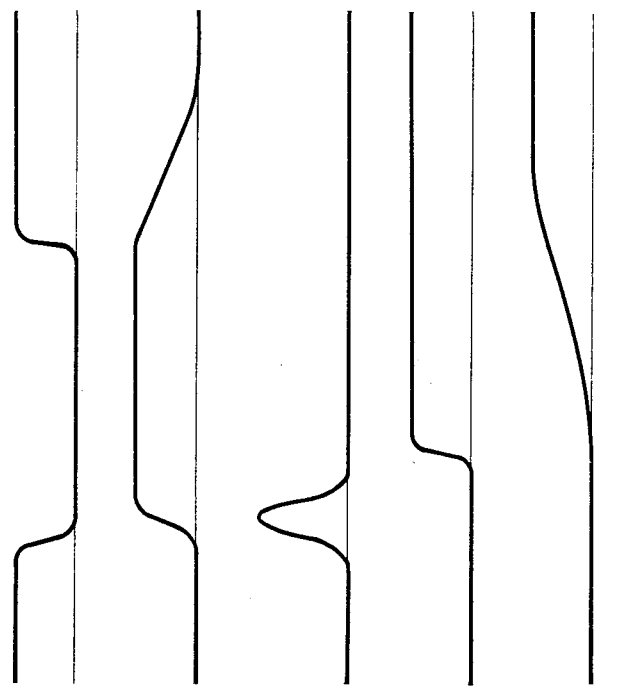
FIGS. 4A to 4E show waveforms of signals for illustrating the precharging operation of the semiconductor memory device shown in FIG. 1.
Figure 6:
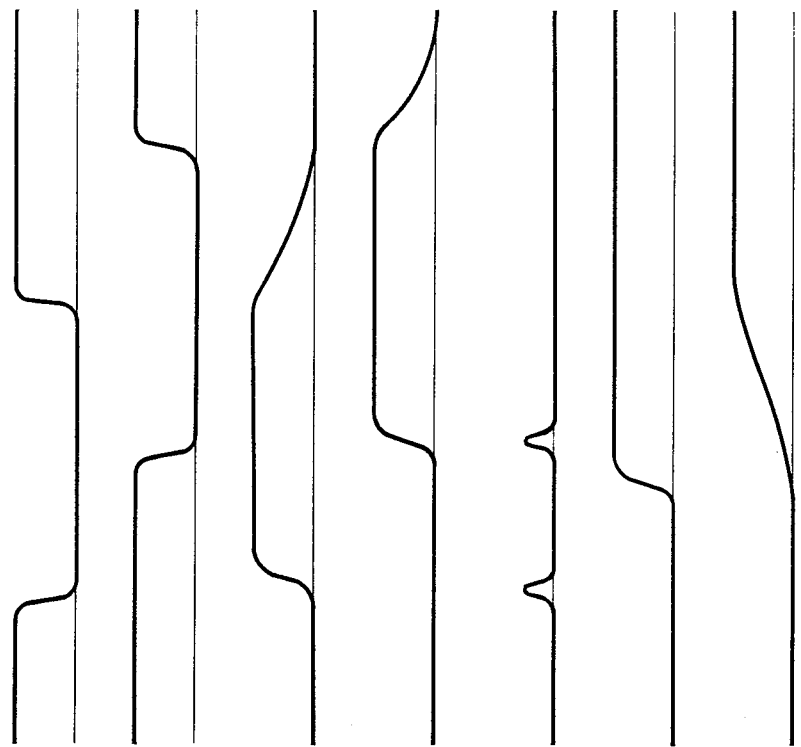
FIGS. 6A to 6G show waveform of signals for illustrating the precharging operation of the semiconductor memory device shown in FIG. 5.

When a precharge control signal shown in FIG. 6A is generated from the precharge control circuit 2, second precharge control signal, delayed with respect to the first precharge control signal to be applied to the precharge circuit PC-1, is gnerated, as shown in FIG. 6B. This second precharge control signal is generated from delay circuit DL(M-1) and is supplied to the precharge circuit PC-M. As a result, the MOS transistors TR0M and TR1M are rendered conductive a predetermined time after the MOS transistors TR01 and TR11 are rendered conductive. The bit lines B0-M and B1-M are precharged, as shown in FIG. 6D, to a predetermined voltage level a predetermined period of time after the bit lines B0-1 and B1-1 are precharged to a predetermined voltage level, as shown in FIG. 6C. In this case, the precharging current will flow, as shown in FIG. 6E, through the bit lines B0-1 and B1-1 when the MOS transistors T0-1 and T1-1 are rendered conductive, and the precharging current will flow through the bit lines B0-M and B1-M when the MOS transistors T0-M and T1-M are rendered conductive. In this manner, the precharging current will flow through the bit lines B0-M and B1-M a predetermined period of time after the precharging current has flowed through the bit lines B0-1 and B1-1. Thus, since the precharging currents flowing through the other bit lines flow in different phases from each other, even if these precharging currents are added together, the amplitude of the synthesized current becomes much less than that of the synthesized current (FIG. 4C) obtained by adding the precharging currents flowing through the bit lines in the same phase.

A precharge control signal shown in FIG. 6B from the delay circuit DL(M-1) is generated at a timing delayed from the rise of the row selection signal shown in FIG. 6F, but since the row selection signal to be applied to one of the memory cells MC-M1 to MC-MN is delayed, as shown in FIG. 6G, with respect to the row selection signal shown in FIG. 6F, no problem occurs. For example, the delay time of the delay circuits DL1 to DL(M-1) may be so determined that each of the bit lines B0-1 and B1-1, B0-2 and B1-2, . . . , and B0-M and B1-M may be set to the predetermined voltage level before a corresponding one of the memory cells MC-11, MC-21, . . . , and MC-M1 connected respectively to the bit lines B0-1 and B1-1, B0-2 and B1-2, . . . , and B0-M and B1-M is energized by the row selection signal transmitted on the word line W1.

As described above, in the semiconductor memory device according to the present invention, the delay circuits DL1 to DL(M-1) each having a delay time to be properly set are used to cause the precharge currents to flow at different timings or in different phases. Accordingly, the precharging currents flowing through the bit lines B0-1 and B1-1, B0-2 and B1-2, . . . , and B0-M and B1-M will be added and synthesized at different timings or in different phases, and therefore, a peak current having a large instantaneous value will not be generated, thus providing no adverse influence on the other signal lines.

Figure 7:
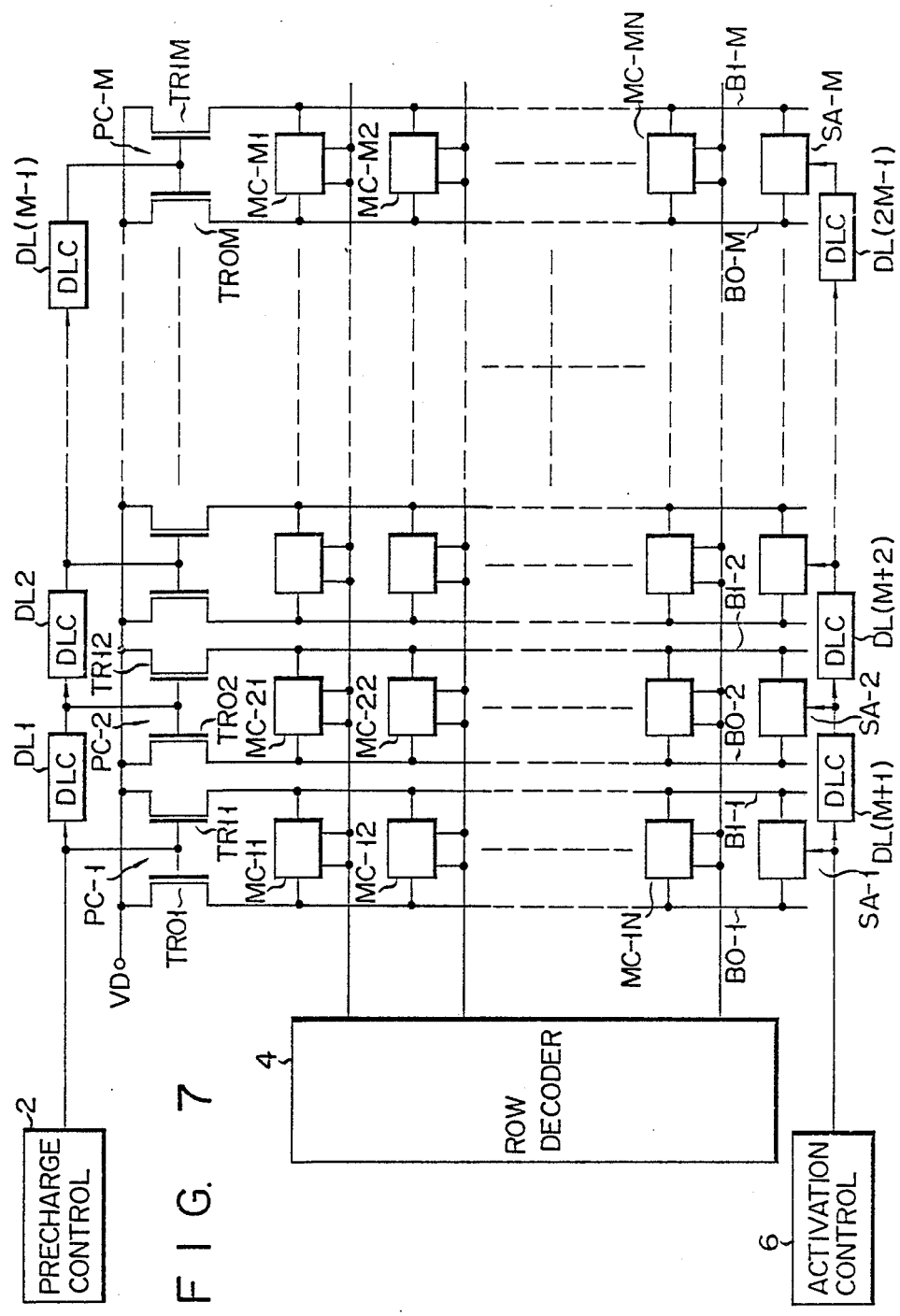
FIG. 7 is a circuit diagram of the semiconductor memory device according to another preferred embodiment of the present invention.

FIG. 7 shows a semiconductor memory device according to another preferred embodiment of the present invention. This embodiment of the semiconductor memory device is constructed similarly to that shown in FIG. 5 except that delay circuits DL(M+1) to DL(2M-1) are provided which are connected in series with each other so that the output signal of the activation control circuit 6 is applied at different timings to the sense amplifier circuits SA-1 to SA-M. If all the sense amplifier circuits SA-1 to SA-M are simultaneously energized in response to the output signal from the activation control circuit 6 in the semiconductor memory device shown in FIG. 5, a peak current having a high instantaneous value will flow through the MOS transistor 24 and corresponding MOS transistors of the other sense amplifier circuits SA-2 to SA-M to the power source terminal VS. It will then flow to the power line connected to the power source terminal VS. In order to prevent this large peak current from flowing through the power line, an activation signal from the activation control circuit 6 is sequentially delayed and then supplied to the sense amplifier circuits SA-2 to SA-M at different timings in this embodiment. In this manner, the sense amplifier circuits SA-1 to SA-M will be energized at different timings, an operating current may thus flow through the sense amplifier circuits SA-1 to SA-M to the power source terminal VS, and the operating current having a small instantaneous value may flow to the power line connected to the power source terminal VS.

Although the present invention has been described with respect to various preferred embodiments, it is not limited to those particular embodiments. Various changes and modifications may be made within the spirit and scope of the present invention. For example, in the embodiment described above in FIG. 7, (M-1) pieces of the delay circuits DL1 to DL(M-1) were used to energize the precharge circuits PC-1 to PC-M in different phases from each other. However, fewer delay circuits may be used to supply a precharge control signal delayed by the same delay time for a selected number of precharge circuits. Similarly, some of the delay circuits DL(M+1) to DL(2M-1) may be removed to commonly supply the activation control signal delayed by the same delay time to some of the sense amplifier circuits SA-1 to SA-N.

Further, in the embodiment described above in FIG. 7, it may be possible to remove the delay circuits DL1 to DL(M-1).

What we claim is:

1. A semiconductor memory device comprising:
   a plurality of semiconductor memory cells arranged in a matrix with columns and rows;
   a plurality of bit lines connected to the memory cells on the same column;
   a plurality of word lines connected to the memory cells on the same row;
   a row decoder circuit for selectively energizing one of said plurality of word lines;
   a power source terminal;
   a control signal generating circuit;
   a plurality of switching circuits each connected between a corresponding one of said plurality of bit lines and said power source terminal; and
   delay means for sequentially setting said switching circuits with different delay times in response to a control signal from said control signal generating circuit such that each of said delay times increases with increasing distance along said word lines between said row decoder circuit and the bit line connected to the switching circuit being set.

2. A semiconductor memory device according to claim 1, which further comprises a plurality of sense amplifier circuits respectively connected to said plurality of bit lines, and an activation signal generating circuit for generating an activation signal for energizing the sense amplifier circuits, and sense amplifier delay means for delaying the activation signal from said activation signal generating circuit and energizing said plurality of sense amplifier circuits at different timings.

3. A semiconductor memory device according to claim 2, wherein said sense amplifier delay means includes delay circuits connected in seried with each other.

4. A semiconductor memory device according to claim 1, wherein said delay means includes delay circuits which are connected in series with each other and whose output terminals are also connected to said switching circuits.

5. A semiconductor memory device according to claim 1 or 4, wherein said plurality of bit lines are arranged in the form of plural pairs and the bit lines of each pair are commonly connected to the memory cells on the same column.

6. A semiconductor memory device according to claim 1 or 4, further comprising a plurality of sense amplifiers repsectively connected to said plurality of bit lines, an activation signal generating circuit, and a sense amplifier delay means for energizing said plurality of sense amplifier circuits in different phases in response to the activation signal from said activation signal generating circuit.

7. A semiconductor memory device according to claim 6, wherein said sense amplifier delay means includes a plurality of delay circuits connected in series, with each other.

8. A semiconductor memory device according to claim 7, wherein said plurality of bit lines are arranged in the form of plural pairs and the bit lines of each pair are commonly connected to the memory cells on the same column and to a corresponding one of said plurality of sense amplifier circuits.

9. A semiconductor memory device comprising:
a plurality of semiconductor memory cells arranged in a matrix with rows and columns;
a plurality of bit lines respectively connected to the memory cells on the same column;
a plurality of word lines respectively connected to the memory cells on the same row;
a row decoder circuit for selectively energizing one of said plurality of word lines;
an activation signal generating circuit;
a plurality of sense amplifiers respectively connected to said plurality of bit lines; and
delay means for sequentially activating said sense amplifiers with different delay times in response to an activation signal from said activation signal generating circuit such that each of said delay times increases with increasing distance along said word lines between said row decoder circuit and the bit lines connected to the sense amplifier to be activated.

10. A semiconductor memory device according to claim 9, wherein said delay means includes delay circuits connected in series with each other.

11. A semiconductor memory device according to claim 10, wherein said plurality of bit lines are arranged in the form of plural pairs and the bit lines of each pair are commonly connected to the memory cells on the same column and to a corresponding one of said plurality of sense amplifier circuits.

* * * * *